United States Patent
Fujii et al.

(10) Patent No.: US 10,001,657 B2
(45) Date of Patent: Jun. 19, 2018

(54) PHOSPHOR CERAMIC, ENCAPSULATED OPTICAL SEMICONDUCTOR ELEMENT, CIRCUIT BOARD, OPTICAL SEMICONDUCTOR DEVICE AND LIGHT-EMITTING DEVICE

(71) Applicant: NITTO DENKO CORPORATION, Ibaraki-shi, Osaka (JP)

(72) Inventors: Hironaka Fujii, Osaka (JP); Masahiro Shirakawa, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days. days.

(21) Appl. No.: 15/318,071

(22) PCT Filed: Feb. 2, 2016

(86) PCT No.: PCT/JP2016/053069
§ 371 (c)(1),
(2) Date: Dec. 12, 2016

(87) PCT Pub. No.: WO2016/132890
PCT Pub. Date: Aug. 25, 2016

(65) Prior Publication Data
US 2017/0139224 A1    May 18, 2017

(30) Foreign Application Priority Data

Feb. 18, 2015   (JP) ................................ 2015-029592
Jan. 5, 2016    (JP) ................................ 2016-000707

(51) Int. Cl.
*G02B 27/48*   (2006.01)
*F21V 3/04*    (2018.01)
(Continued)

(52) U.S. Cl.
CPC .......... *G02B 27/48* (2013.01); *C09K 11/7774* (2013.01); *F21V 3/0463* (2013.01);
(Continued)

(58) Field of Classification Search
None
See application file for complete search history.

(56) References Cited

U.S. PATENT DOCUMENTS

2002/0061811 A1*  5/2002  Merkel ................. C04B 35/447
                                              501/106
2004/0145308 A1   7/2004  Rossner et al.
(Continued)

FOREIGN PATENT DOCUMENTS

EP    2 646 524 A1    10/2013
JP    2004-146835 A    5/2004
(Continued)

OTHER PUBLICATIONS

International Search Report for PCT/JP2016/053069 dated May 10, 2016 [PCT/ISA/210].
(Continued)

*Primary Examiner* — Michelle Mandala
(74) *Attorney, Agent, or Firm* — Sughrue Mion, PLLC

(57) ABSTRACT

The phosphor ceramic has pores with a pore diameter of 3.0 μm or more and 12.0 μm or less. In the phosphor ceramic, a pore volume percentage of pores with a pore diameter of 3.0 μm or more and 12.0 μm or less is 1.5% by volume or more and 9.5% by volume or less.

9 Claims, 9 Drawing Sheets

(51) Int. Cl.
- *F21V 7/00* (2006.01)
- *F21V 7/04* (2006.01)
- *F21V 13/02* (2006.01)
- *F21V 29/70* (2015.01)
- *C09K 11/77* (2006.01)
- *H01L 33/50* (2010.01)
- *H01L 33/62* (2010.01)
- *H01L 33/60* (2010.01)
- *H01L 33/52* (2010.01)
- *F21Y 115/30* (2016.01)
- *F21Y 115/10* (2016.01)

(52) U.S. Cl.
CPC .............. *F21V 3/08* (2018.02); *F21V 7/0008* (2013.01); *F21V 7/04* (2013.01); *F21V 13/02* (2013.01); *F21V 29/70* (2015.01); *H01L 33/502* (2013.01); *H01L 33/52* (2013.01); *H01L 33/60* (2013.01); *H01L 33/62* (2013.01); *F21Y 2115/10* (2016.08); *F21Y 2115/30* (2016.08)

(56) References Cited

U.S. PATENT DOCUMENTS

| 2008/0187746 A1 | 8/2008 | De Graaf et al. |
| 2009/0066221 A1 | 3/2009 | Schmidt et al. |
| 2011/0181173 A1 | 7/2011 | De Graaf et al. |

FOREIGN PATENT DOCUMENTS

| JP | 2008-533270 A | 8/2008 |
| JP | 2009-530788 A | 8/2009 |
| JP | 2012-64484 A | 3/2012 |
| JP | 5049336 B2 | 10/2012 |
| WO | 2012/075018 A1 | 6/2012 |

OTHER PUBLICATIONS

Written Opinion for PCT/JP2016/053069 dated May 10, 2016 [PCT/ISA/237].

Decision to Grant dated Jul. 26, 2016 issued by the Japanese Patent Office in corresponding JP application No. 2016-000707.

Extended European Search Report dated Feb. 7, 2018, issued by EPO in corresponding Application No. 1675227.0.

* cited by examiner

FIG.1A
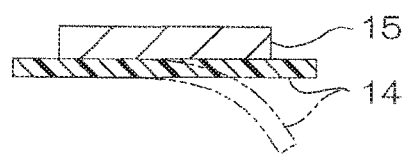
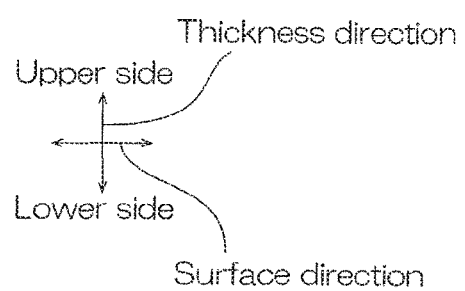
FIG.1B
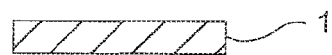

FIG.3A
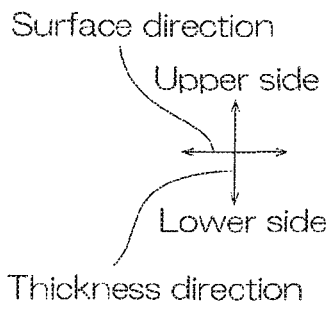
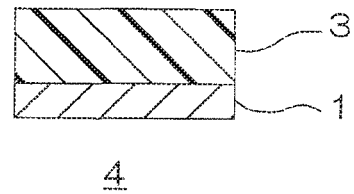
FIG.3B
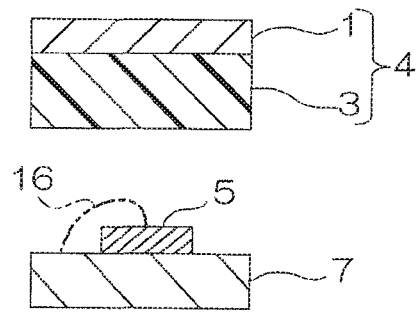
FIG.3C
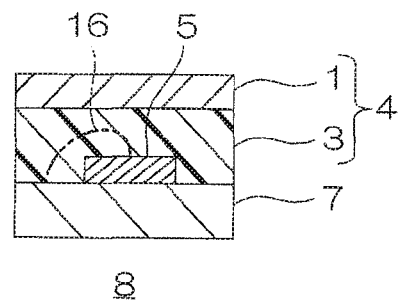

Surface direction
Upper side
Lower side
Thickness direction

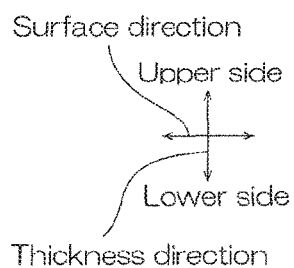
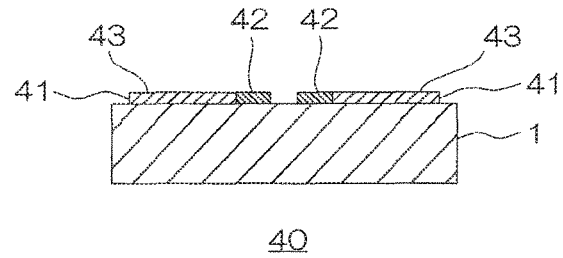
FIG.6A
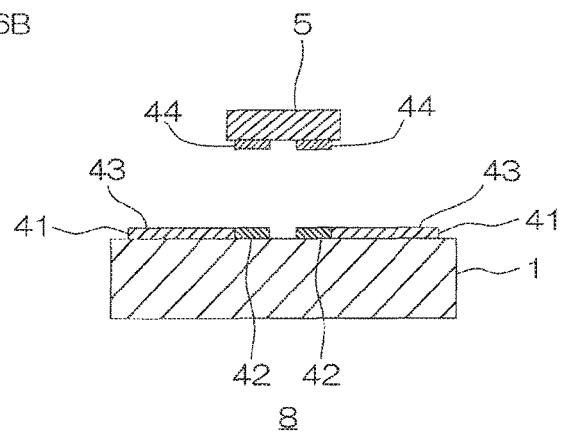
FIG.6B
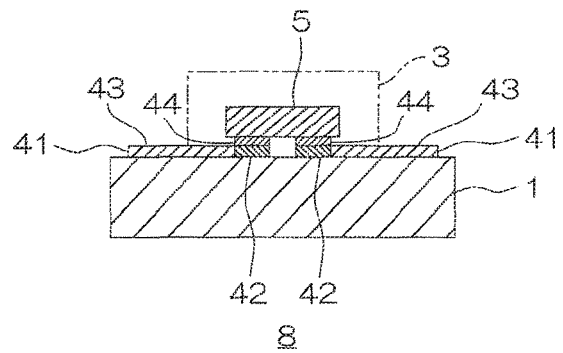
FIG.6C

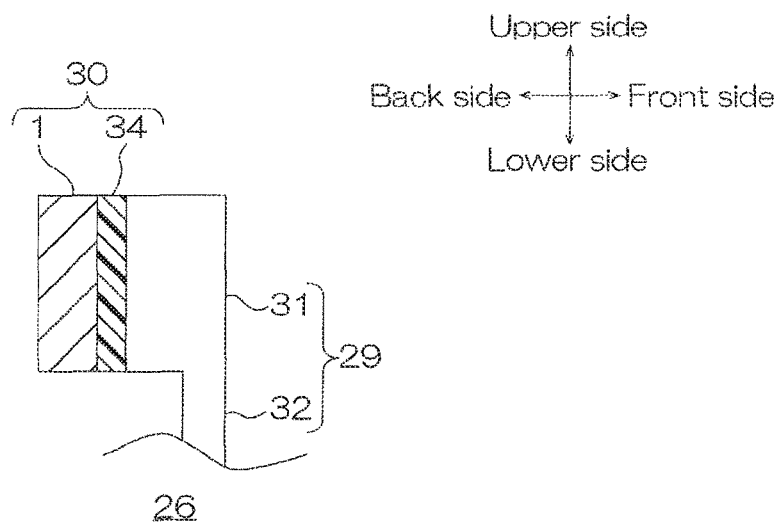
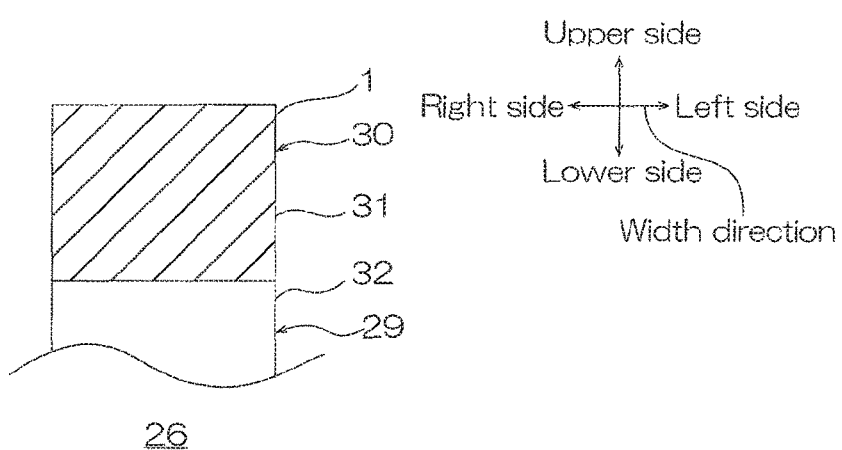

PHOSPHOR CERAMIC, ENCAPSULATED OPTICAL SEMICONDUCTOR ELEMENT, CIRCUIT BOARD, OPTICAL SEMICONDUCTOR DEVICE AND LIGHT-EMITTING DEVICE

CROSS REFERENCE TO RELATED APPLICATIONS

This application is a National Stage of International Application No. PCT/JP2016/053069, filed on Feb. 2, 2016, which claims priority from Japanese Patent Application Nos. 2015-029592, filed on Feb. 18, 2015, and 2016-000707, filed on Jan. 5, 2016, the contents of all of which are incorporated herein by reference in their entirety.

TECHNICAL FIELD

The present invention relates to a phosphor ceramic, and an encapsulated optical semiconductor element, circuit board, optical semiconductor device, and light-emitting device including the phosphor ceramic.

BACKGROUND ART

Light-emitting devices such as optical semiconductor devices generally include, for example, LED (light-emitting diode element) or LD (laser diode) that emits blue light, and a phosphor layer that is capable of converting the blue light to yellow light and is provided on the LED. The light-emitting device emits white light by color mixture of blue light emitted from the LED and passed through the phosphor layer with yellow light obtained by converting the wavelength of a portion of the blue light at the phosphor layer.

Patent Document 1 (see Patent Document 1 below) has proposed, for such a phosphor layer, for example, a conversion element composed of a ceramic material.

Patent Document 1 discloses a conversion element having a density of 97% or more of the density of theoretical solid-state ceramic material, and having pores therein with a diameter of substantially 250 nm to 2900 nm.

The conversion element of Patent Document 1 has micropores on the order of nano, and therefore improves transmittance in a wider viewing angle.

CITATION LIST

Patent Document

Patent Document 1: Japanese patent no. 5049336

SUMMARY OF THE INVENTION

Problem to be Solved by the Invention

However, with the conversion element of Patent Document 1, pores with the pore diameter on the order of nanometers have to be produced, but crystals of ceramics grow when producing the conversion element of ceramics (high temperature sintering process), and therefore pores having a pore diameter on the order of nanometers easily disappear. That is, with the conversion element of Patent Document 1, there are disadvantages in that adjustment of the size of the pores is difficult, and productivity is poor.

Further improvement in transparency and scattering properties are demanded as well.

Furthermore, there are disadvantages such as phenomenon of speckle noise, which gives unnatural glaring to sight when an object is irradiated with light, for example, excitation light from LD with its wavelength converted with phosphor.

An object of the present invention is to provide a phosphor ceramic with excellent transmittance and scattering properties, productivity, and that is capable of decreasing speckle noise and an encapsulated optical semiconductor element, circuit board, optical semiconductor device, and light-emitting device including the phosphor ceramic.

Means for Solving the Problem

The present invention [1] includes a phosphor ceramic having pores with a pore diameter of 3.0 μm or more and 12.0 μm or less, wherein in the phosphor ceramic, a pore volume percentage of pores with a pore diameter of 3.0 μm or more and 12.0 μm or less is 1.5% by volume or more and 9.5% by volume or less.

The present invention [2] includes the phosphor ceramic of [1], wherein the phosphor ceramic is platy, and satisfies the formula below:

$$V \leq 1.30 \times (-\log T)$$

(where V represents a volume percentage (%) of pores with a pore diameter of less than 3.0 μm, and T represents the thickness (mm) of the phosphor ceramic).

The present invention [3] includes the phosphor ceramic of [1] or [2], wherein at least one of (1) to (3) below is satisfied:
(1) 67 ppm or less of Na is contained,
(2) 23 ppm or less of Mg is contained, and
(3) 21 ppm or less of Fe is contained.

The present invention [4] includes the phosphor ceramic of any one of [1] to [3], wherein the phosphor ceramic has an average pore diameter of 3.0 μm or more and 10.0 μm or less.

The present invention [5] includes an optical semiconductor device including a substrate, an optical semiconductor element mounted on the substrate, an adhesive layer, and the phosphor ceramic of any one of [1] to [4] disposed on the adhesive layer on the opposite side to the optical semiconductor element to face the optical semiconductor element.

The present invention [6] includes an optical semiconductor device including a substrate, an optical semiconductor element mounted on the substrate, an encapsulating layer encapsulating the optical semiconductor element, and the phosphor ceramic of any one of [1] to [4] disposed on the encapsulating layer on the opposite side to the optical semiconductor element to face the optical semiconductor element.

The present invention [7] includes an encapsulated optical semiconductor element including an optical semiconductor element, an encapsulating layer encapsulating the optical semiconductor element, and the phosphor ceramic of any one of [1] to [4] disposed on the encapsulating layer on the opposite side to the optical semiconductor element to face the optical semiconductor element.

The present invention [8] includes a circuit board including the phosphor ceramic of any one of [1] to [4] for mounting the optical semiconductor element on one side in the thickness direction, and an electrode wiring for electrically connecting with the optical semiconductor element and laminated on one surface in the thickness direction of the phosphor ceramic.

The present invention [9] includes a light-emitting device including a light source that emits light to one side, a reflection mirror disposed on one side in spaced-apart relation from the light source, and in which a through hole for the light to pass through is formed, and the phosphor ceramic of any one of [1] to [4] disposed on one side in spaced-apart relation from the reflection mirror for the light to be emitted.

Effects of the Invention

The phosphor ceramic of the present invention is excellent in transmittance and scattering properties, and can reduce speckle noise. Furthermore, excellent productivity can be achieved.

The encapsulated optical semiconductor element, circuit board, optical semiconductor device, and light-emitting device of the present invention including the phosphor ceramic of the present invention can suppress decrease in luminosity, and allows for excellent viewing angle. Furthermore, with the encapsulated optical semiconductor element or device in which particularly LD is used as the optical semiconductor element for the light source, speckle noise can be reduced. Furthermore, production costs can be decreased.

BRIEF DESCRIPTION OF THE DRAWINGS

FIG. 1A and FIG. 1B are process diagrams illustrating steps of producing the phosphor ceramic of the present invention in a first embodiment, FIG. 1A illustrating a step of producing a green sheet, and FIG. 1B illustrating a step of baking.

FIG. 3A to FIG. 3C are process diagrams illustrating steps of producing the optical semiconductor device of the present invention in a second embodiment using the phosphor ceramic shown in FIG. 1B, FIG. 3A illustrating a step of producing the encapsulation sheet, FIG. 3B illustrating a step of disposing the encapsulation sheet, and FIG. 3C illustrating an encapsulating step.

FIG. 6A to FIG. 6C are process diagrams illustrating steps of producing the optical semiconductor device in a third embodiment using the phosphor ceramic shown in FIG. 1B, FIG. 6A illustrating a step of producing a circuit board, FIG. 6B illustrating a step of disposing the circuit board, and FIG. 6C illustrating a mounting step.

FIG. 8A and FIG. 8B are diagrams illustrating a wavelength conversion heat dissipation member included in the light-emitting device shown in FIG. 7, FIG. 8A illustrating a side sectional view, and FIG. 8B illustrating a rear view.

DESCRIPTION OF EMBODIMENTS

In FIG. 1A and FIG. 1B, up-down direction on the plane of the paper of FIG. 1A and FIG. 1B is referred to as "up-down direction" (first direction, thickness direction), the upper side on the plane of the sheet is upper side, and the lower side on the plane of the paper is lower side. The left-right direction on the plane of the paper of FIG. 1A and FIG. 1B are referred to as "surface direction" (second direction, direction perpendicular to the first direction), the right direction on the plane of the paper is one side in the surface direction, and the left direction on the plane of the paper of FIG. 1A and FIG. 1B is the other side in the surface direction. In FIG. 2 to FIG. 6 and FIG. 9 as well, the directions in FIG. 1A and FIG. 1B are based.

Figure 7:
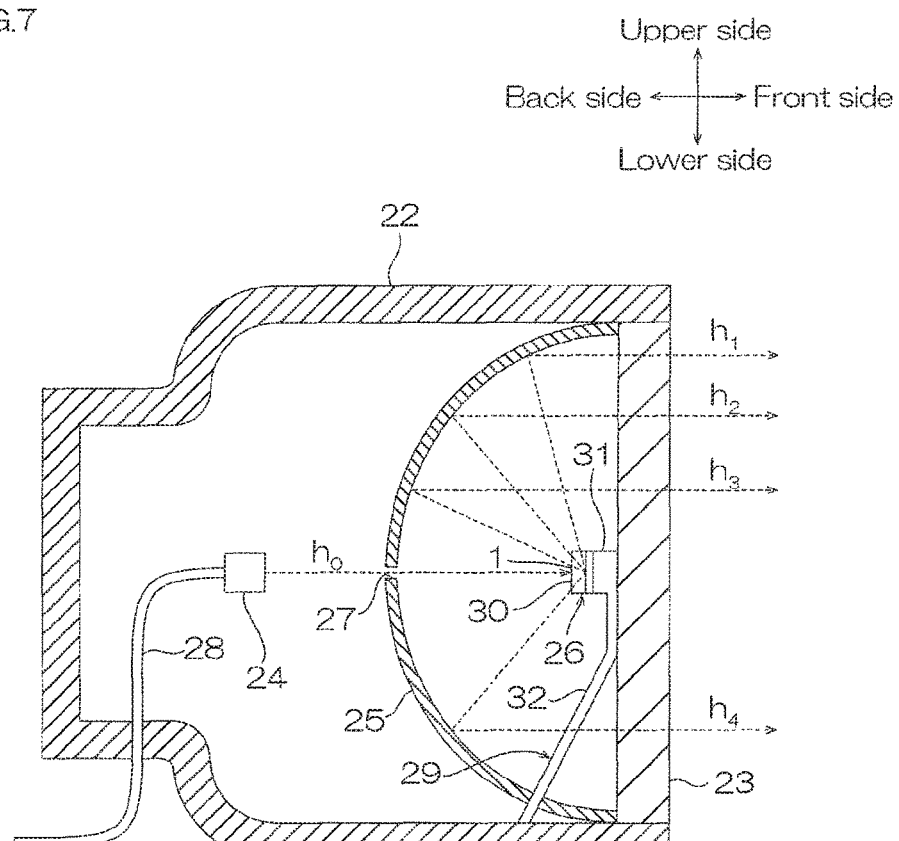
FIG. 7 shows a light-emitting device including the phosphor ceramic shown in FIG. 1B.

In FIG. 7, the up-down direction on the plane of the paper of FIG. 7 is referred to as "up-down direction" (first direction, thickness direction), the upper side on the plane of the sheet is upper side, and the lower side on the plane of the paper is the lower side. The left-right direction on the plane of the paper of FIG. 7 is referred to as "front-back directions" (second direction, width direction, direction perpendicular to the first direction), the right direction on the plane of the paper is front side, and the left direction on the plane of the paper of FIG. 1 is back side. The paper thickness direction of FIG. 7 is referred to as "left-right directions" (third direction, direction perpendicular to first direction and second direction), the near side in the paper thickness direction of FIG. 7 is left side, and the further side in the paper thickness direction of FIG. 7 is right side. In FIG. 8A and FIG. 8B, the directions of FIG. 7 are based.

1. Phosphor Ceramic

Referring to FIG. 1B, a phosphor ceramic plate 1 in an embodiment of the phosphor ceramic of the present invention is described.

The phosphor ceramic plate 1 is formed, as shown in FIG. 1B, into a plate from a ceramic phosphor material (baked product), and contains phosphor.

The phosphor contained in the phosphor ceramic plate 1 has a wavelength conversion function, and examples thereof include yellow phosphor that is capable of converting blue light to yellow light, and red phosphor that is capable of converting blue light to red light.

Examples of yellow phosphor include silicate phosphor such as $(Ba,Sr,Ca)_2SiO_4$:Eu, and $(Sr,Ba)_2SiO_4$:Eu (barium orthosilicate (BOS)); garnet phosphor having garnet crystal structure such as $(Y, Gd, Ba, Ca)_3(Al, Si, Ge, B, P, Ga)_5O_{12}$:Ce (YAG (yttrium•aluminum•garnet): Ce), and $Tb_3Al_3O_{12}$:Ce (TAG (terbium•aluminum•garnet): Ce); and for example, oxynitride phosphor such as Ca-α-SiAlON. Examples of red phosphor include nitride phosphor such as $CaAlSiN_3$:Eu, and $CaSiN_2$: Eu.

The phosphor ceramic plate 1 has pores therein. Particularly, the phosphor ceramic plate 1 has pores (hereinafter may also be referred to as "middle pore") with a pore diameter of 3.0 µm or more and 12.0 µm or less.

The lower limit of the volume percentage of the middle pore in the phosphor ceramic plate 1 is 1.5% by volume or more, preferably 2.0% by volume or more, more preferably 2.5% by volume or more. The upper limit is 9.5% by volume or less, preferably 8.0% by volume or less.

By setting the volume percentage of the middle pore within the above-described range, transmittance and scattering properties of the phosphor ceramic plate 1 can be improved.

The pore diameter of the pore is the maximum length of the pore, and can be measured by observing the pore diameter of the cross sectional surface of the phosphor ceramic plate 1 using a laser microscope (device name: laser tech, VL 2000D, object lens ×20, magnification 1800).

The pore volume is calculated based on spheres using the pore diameter (pore maximum length) of the above-described pore as the pore diameter.

The phosphor ceramic plate 1 may include, in addition to the middle pores, a pore having a pore diameter of more than 12.0 µm (hereinafter may also be referred to as "large pore") and a pore having a pore diameter of less than 3.0 µm (hereinafter may also be referred to as "small pore").

The phosphor ceramic plate 1 has a large pore volume percentage of, for example, 12.0% by volume or less, preferably 9.0% by volume or less, more preferably 5.0% by volume or less, further preferably 2.0% by volume or less. The upper limit of the pore diameter of the large pore is, for example, 30.0 µm or less. The large pore volume percentage of the above-described upper limit or less allows for the phosphor ceramic plate 1 with excellent transparency and productivity. Impurities contained in the phosphor ceramic plate 1 can also be reduced.

The phosphor ceramic plate 1 has a small pore volume percentage of, for example, 2.0% by volume or less, preferably 1.2% by volume or less, more preferably 1.0% by volume or less, more preferably 0.8% by volume or less. The lower limit of the pore diameter of the small pore is, for example, 0.3 µm or more. The small pore volume percentage of the above-described upper limit or less allows for the phosphor ceramic plate 1 with excellent transparency and productivity.

The pore has an average pore diameter of, for example, 2.5 µm or more, preferably 3.0 urn or more, and for example, 20.0 µm or less, preferably 15.0 µm or less, more preferably 10.0 µm or less, more preferably 5.5 µm or less. The pore with the average pore diameter within the above-described range allows for the phosphor ceramic plate 1 with excellent transparency and scattering properties. Furthermore, in view of reducing speckle noise (speckle contrast ratio), the average pore diameter is preferably 10.0 µm or less.

Next, description is given below of a method for producing the phosphor ceramic plate 1 with reference to FIG. 1A to FIG. 1B.

The method for producing the phosphor ceramic plate 1 include, for example, a step of producing a green sheet (ref: FIG. 1A), and a baking step (FIG. 1B). The steps are described below.

In the step of producing a green sheet, a phosphor composition containing a phosphor material and organic particles are baked. Preferably, as shown in FIG. 1A, a slurry (phosphor composition slurry) containing the phosphor composition is applied on the upper face of the release substrate 14 and dried. The green sheet 15 is produced in this manner.

The phosphor composition slurry contains a solvent and a phosphor composition containing a phosphor material and organic particles. That is, the phosphor composition slurry contains the phosphor material, organic particles, and solvent.

The phosphor material is a raw material composing the above-described phosphor, and is suitably selected in accordance with the phosphor. Examples of the phosphor material include simple substance of metals that compose the phosphor, their metal oxides, and their metal nitrides. To be specific, when forming $Y_3Al_5O_{12}$:Ce as phosphor, examples of the phosphor material include metal oxides such as yttrium-containing compounds such as yttrium oxide, aluminum-containing compounds such as aluminum oxide, and cerium-containing compounds such as cerium oxide. The phosphor material is formed into, for example, a particle shape.

The phosphor material has a purity of, for example, 99.0 mass % or more, preferably 99.9 mass % or more. In this manner, impurities contained in the phosphor ceramic plate 1 can be reduced.

The organic particles are contained in the phosphor composition slurry for forming predetermined pores in the phosphor ceramic plate 1.

The material of the organic particles can be those completely thermally decomposed in the baking step, and for example, thermoplastic resin and thermosetting resin can be used.

Examples of the thermoplastic resin include acrylic resin, styrene resin, acryl-styrene resin, polycarbonate resin, benzoguanamine resin, polyolefin resin, polyester resin, polyamide resin, and polyimide resin. Preferably, in view of productivity, acrylic resin (particularly, polymethyl methacrylate, etc.) is used.

Examples of the thermosetting resin include epoxy resin, silicone resin, and urethane resin.

The organic particles has an average particle size of, for example, 2.0 µm or more, preferably 3.4 µm or more, more preferably 4.0 µm or more, and for example, 25.0 µm or less, preferably 15.0 µm or less, more preferably 8.0 µm or less. The average particle size of the organic particles below the above-described lower limit causes crystals of the phosphor ceramic plate 1 to grow excessively toward the inside pores, and may cause the pores to disappear when baking the green sheet 15 to produce the phosphor ceramic plate 1. Meanwhile, the average particle size of the organic particles of more than the above-described upper limit may cause the large pores to be formed inside the phosphor ceramic plate 1 in a great amount, and transmittance and strength of the phosphor ceramic plate 1 may be reduced. Impurities contained in the phosphor ceramic plate 1 may increase.

The average particle size of the organic particles can be measured, for example, by using a particle size distribution analyzer (manufactured by Beckman Coulter, Inc., "LS 13 320") with laser diffraction scattering method.

The organic particle content relative to the total amount of the phosphor material and the organic particles is, for example, 1.5% by volume or more, preferably 2.0% by volume or more, and for example, 12.0% by volume or less, preferably 10.0% by volume or less, more preferably 8.0% by volume or less.

By setting the organic particle content within the above-described range, the volume percentage of the pores formed in the phosphor ceramic plate 1 can be adjusted to be within a suitable range.

To the phosphor composition, as necessary, binder resin can be further added.

For the binder resin, a known binder resin used for production of the green sheet 15 can be used, and examples thereof include acrylic polymer, butyral polymer, vinyl polymer, and urethane polymer. Preferably, acrylic polymer is used.

The binder resin content relative to 100 parts by volume of the phosphor material is, for example, 5 parts by volume or more, preferably 15 parts by volume or more, and for example, 120 parts by volume or less, preferably 80 parts by volume or less, more preferably 60 parts by volume or less.

To the phosphor composition, as necessary, known additives such as a dispersing agent, a plasticizer, and a sintering auxiliary agent can further be added.

Examples of the solvent contained in the phosphor composition slurry include water, and organic solvents such as acetone, methyl ethyl ketone, methanol, ethanol, toluene, methyl propionate, and methylcellosolve.

The phosphor composition slurry has a solvent content of, for example, 1 to 30 mass %.

The phosphor composition slurry is prepared by blending the above-described components at the above-described ratio, and subjecting the mixture to wet blending with, for example, a ball mill. That is, a phosphor composition slurry is prepared.

At this time, the above-described components can be subjected to wet blending all at once. The phosphor composition slurry can also be prepared by blending components excluding the organic particles by wet blending to prepare a first slurry, and then subjecting the first slurry to wet blending with the organic particles.

Examples of the release substrate 14 include resin films including polyester films such as polyethylene terephthalate (PET) film; polycarbonate films; polyolefin films such as polyethylene film and polypropylene film; polystyrene films; acrylic films; and silicone resin films, and fluorine resin film. Examples also include metal foils such as copper foil and stainless steel foil. Preferably, resin film, even more preferably, polyester film is used. The surface of the release substrate 14 is treated with, as necessary, a release treatment to increase releaseability.

The release substrate 14 has a thickness of, for example, 10 to 200 μm, in view of, for example, handleability and costs.

The phosphor composition slurry can be applied on the release substrate 14 by, for example, known application methods such as doctor blade coating, gravure coating, fountain coating, cast coating, spin coating, and roll coating.

The drying temperature is, for example, 20° C. or more, preferably 50° C. or more, and for example, 200° C. or less, preferably 150° C. or less.

The drying time is, for example, 1 minute or more, preferably 2 minutes or more, and for example, 24 hours or less, preferably 5 hours or less.

The thus produced green sheet 15 is ceramics before sintering of the phosphor ceramic plate 1, and formed into a plate shape.

Thereafter, as shown in the phantom line of FIG. 1A, the release substrate 14 is removed from the green sheet 15.

The green sheet 15 can be formed, to achieve a desired thickness, by laminating a plurality of (plural layers) green sheets 15 by heat lamination.

The green sheet 15 has a thickness of, for example, 10 μm or more, preferably 30 μm or more, and for example, 500 μm or less, preferably 200 μm or less.

In the baking step, as shown in FIG. 1B, the green sheet 15 is baked. The phosphor ceramic plate 1 is produced in this manner.

The baking temperature is, for example, 1300° C. or more, preferably 1500° C. or more, and for example, 2000° C. or less, preferably 1800° C. or less.

The baking time is, for example, 1 hour or more, preferably 2 hours or more, and for example, 24 hours or less, preferably 8 hours or less.

The baking can be conducted under normal pressure, or can be conducted under reduced pressure or under vacuum.

The temperature increase speed in baking is, for example, 0.5 to 20° C./min.

Before the above-described baking (main baking), to thermally decompose and remove organic components such as the binder resin and the dispersing agent, preheating under air at, for example, 600 to 1300° C. for debinder processing can be conducted using an electric furnace.

By baking (when binder processing is conducted, baking and binder processing), the organic particles are baked, and the pores are formed in the phosphor ceramic plate 1. The thus produced phosphor ceramic plate 1 is formed into a plate shape.

The phosphor ceramic plate 1 has a thickness T of, for example, 10 μm or more, preferably 30 μm or more, and for example, 500 μm or less, preferably 200 μm or less, more preferably 130 μm or less.

The phosphor ceramic plate 1 satisfies, preferably, the formula below.

$$V \leq 1.30 \times (-\log T)$$

V represents volume percentage (%) of the pore (small pore) with a pore diameter of less than 3.0 μm. T represents the thickness (mm) of the phosphor ceramic plate 1.

In this manner, generation of excessive pores when the thickness is sufficiently thick can be reduced, and reduction of transmittance and strength of the phosphor ceramic plate 1 can be suppressed.

The phosphor ceramic plate 1 satisfies preferably, at least one of the requirements (1) to (3) below:

(1) 67 ppm or less, preferably 50 ppm or less of Na is contained, (2) 23 ppm or less, preferably 20 ppm or less of Mg is contained, and (3) 21 ppm or less, preferably 15 ppm or less, more preferably 10 ppm or less of Fe is contained.

The above-described elements can be measured, for example, by ICP-MS analysis.

The above-described elements are impurities, and by setting the above-described impurities to the above-described upper limit or less, excellent quantum efficiency can be achieved.

The phosphor ceramic plate 1 has pores with a pore diameter of 3.0 μm or more and 12.0 μm or less, and the phosphor ceramic plate 1 has a pore volume percentage of pores with a pore diameter of 3.0 μm or more and 12.0 μm or less of 1.5% by volume or more and 9.5% by volume or less. Therefore, light entered from the optical semiconductor element to the inside the phosphor ceramic plate 1 can be excellently transmitted and scattered. Therefore, excellent transmittance and scattering properties can be achieved.

Furthermore, speckle noise can be reduced particularly for the light which is coming from LD and whose wavelength is converted using the ceramic plate 1.

The phosphor ceramic plate 1 has a predetermined volume of relatively large pores (middle pores). Therefore, at the time of production of the phosphor ceramic plate 1 (baking of the green sheet), micropores that are difficult to be formed do not have to be formed. Therefore, excellent productivity can be achieved.

Furthermore, the phosphor ceramic plate 1 is formed from phosphor ceramic, and therefore excellent heat resistance and heat-releasing characteristics can be achieved.

Such a phosphor ceramic plate 1 is an object of merchandise by itself as a component of the optical semiconductor device 8.

2. Optical Semiconductor Device

The optical semiconductor device 8 including the phosphor ceramic plate 1 is described below.

First Embodiment

A first embodiment of the optical semiconductor device 8 and its production method is described with reference to FIG. 2A to FIG. 2C.

The production method of the optical semiconductor device 8 in the first embodiment includes, for example, a step of producing a phosphor adhesive sheet (ref: FIG. 2A), a step of disposing the phosphor adhesive sheet (ref: FIG. 2B), and an adhesion step (ref: FIG. 2C).

Figure 2A:
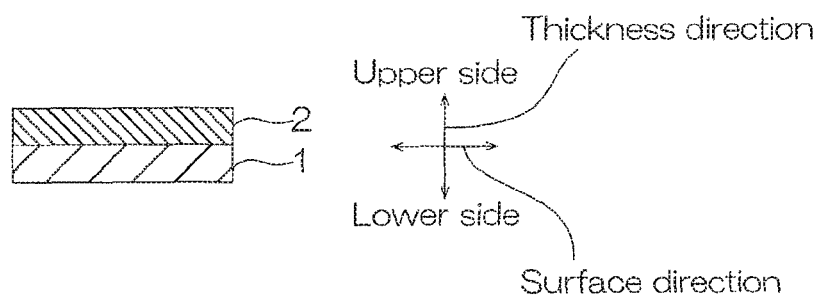
FIG. 2A to FIG. 2C are process diagrams illustrating steps of producing the optical semiconductor device in the first embodiment using the phosphor ceramic shown in FIG. 1B, FIG. 2A illustrating a step of producing a phosphor adhesive sheet, FIG. 2B illustrating a step of disposing the phosphor adhesive sheet, and FIG. 2C illustrating an adhesion step.

In the step of producing a phosphor adhesive sheet, as shown in FIG. 2A, an adhesive layer 2 is laminated on the phosphor ceramic plate 1.

The adhesive layer 2 is disposed on the entire upper face (one surface) of the phosphor ceramic plate 1, and is formed into a sheet shape from the adhesive composition.

The adhesive composition is not limited, and examples thereof include pressure-sensitive adhesive compositions such as silicone compositions and acrylic compositions; thermosetting adhesive compositions such as silicone compositions and epoxy compositions; and inorganic adhesive compositions such as glass compositions and ceramic compositions. Preferably, in view of mass production, durability, and heat resistance, silicone compositions are used.

The adhesive layer 2 has a thickness of, in view of pressure-sensitive adhesion, for example, 5 μm or more and 200 μm or less, preferably, in view of thermal conductivity, 100 μm or less, more preferably 50 μm or less.

To laminate the adhesive layer 2 on the upper face of the phosphor ceramic plate 1, when the adhesive composition is prepared as varnish, for example, the varnish is applied on the entire upper face of the phosphor ceramic plate 1 by, for example, a known application method such as bar coating. In this manner, a film of the adhesive composition is formed. Then, as necessary, the solvent is distilled off.

Alternatively, the varnish is applied on the surface of, for example, a release sheet to form a coating, and as necessary, after the solvent is distilled off, the coating can be transferred from the release sheet to the phosphor ceramic plate 1.

The phosphor adhesive sheet 6 including the phosphor ceramic plate 1, and the adhesive layer 2 laminated thereon is produced in this manner. The phosphor adhesive sheet 6 is composed of the phosphor ceramic plate 1 and the adhesive layer 2, does not include the optical semiconductor element 5, and is an object of merchandise by itself as a component of the optical semiconductor device 8.

Figure 2B:
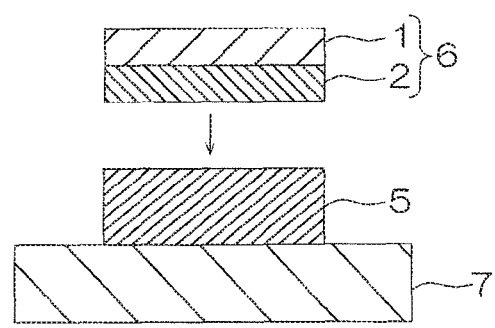

In the step of disposing the phosphor adhesive sheet, as shown in FIG. 2B, the substrate 7 on which the optical semiconductor element 5 is mounted, and the phosphor adhesive sheet 6 are disposed to face each other. That is, the substrate 7 and the phosphor adhesive sheet 6 are disposed in spaced-apart relation so that the optical semiconductor element 5 and the adhesive layer 2 are facing each other.

The substrate 7 is formed into a flat plate shape that is larger than the optical semiconductor element 5 when viewed from the top. The substrate 7 is composed of an insulating substrate such as, for example, a silicon substrate, a ceramic substrate, a polyimide resin substrate, and a laminate substrate in which an insulating layer is laminated on the metal substrate. On the upper face of the substrate 7, a conductive pattern (not shown) including an electrode is formed.

The optical semiconductor element 5 is, for example, an element that emits blue light (to be specific, blue LED, blue LD), and is connected to the electrode (not shown) of the substrate 7 by, for example, flip chip mounting or wire bonding connection. When the optical semiconductor element 5 is connected to the substrate 7 by wire bonding, the phosphor adhesive sheet 6 to be adhered to the optical semiconductor element 5 is formed into a shape that deviates (detour) the wire.

Figure 2C:
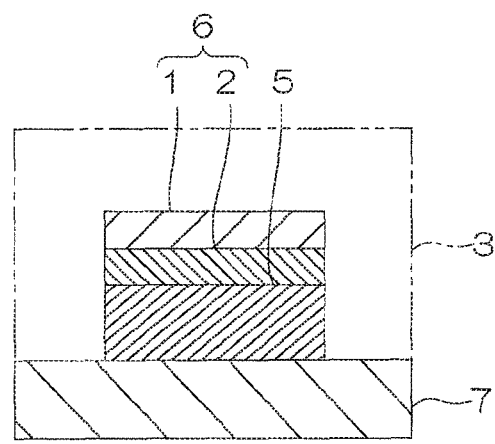

In the adhesion step, as shown in FIG. 2C, the phosphor adhesive sheet 6 is bonded to the optical semiconductor element 5.

To be specific, the phosphor ceramic plate 1 is allowed to adhere onto the optical semiconductor element 5 through the adhesive layer 2.

Bonding of the phosphor adhesive sheet 6 with the optical semiconductor element 5 is conducted at a normal temperature (to be specific, 20 to 25° C.). As necessary, bonding can also be performed by heating the phosphor adhesive sheet 6 to, for example, 30 to 150° C.

The optical semiconductor device 8 to which the phosphor ceramic plate 1 is bonded through the adhesive layer 2 is produced in this manner.

That is, the optical semiconductor device 8 includes the substrate 7, the optical semiconductor element 5 mounted on the substrate 7, the adhesive layer 2 formed on the optical semiconductor element 5, and the phosphor ceramic plate 1 disposed on the adhesive layer 2 (opposite side to the optical semiconductor element 5) to face the optical semiconductor element 5.

When the optical semiconductor element 5 is blue LED, the optical semiconductor device 8 is obtained as a white light-emitting device.

Thereafter, as necessary, as shown in the phantom line of FIG. 2C, the encapsulating layer 3 can be provided on the optical semiconductor device 8. The encapsulating layer 3 is disposed on the substrate 7 so as to cover the optical semiconductor element 5 and the phosphor adhesive sheet 6.

The encapsulating layer 3 is formed from an encapsulation resin composition. The encapsulation resin composition includes a known transparent resin that are used for embedding and encapsulating the optical semiconductor element 5, and examples of the transparent resin include thermosetting resins such as silicone resin, epoxy resin, and urethane resin, and thermoplastic resins such as acrylic resin, styrene resin, polycarbonate resin, and polyolefin resin.

The encapsulating layer 3 is provided on the optical semiconductor device 8 by, for example, a method in which the encapsulating layer 3 is directly formed on the optical semiconductor device 8, and a method in which the encapsulating layer 3 is formed on another release sheet, and then the encapsulating layer 3 is transferred from the release sheet to the optical semiconductor device 8 by, for example, a laminator, or thermocompression bonding.

The optical semiconductor device 8 in the first embodiment includes the phosphor ceramic plate 1, and therefore transmittance and scattering properties of light emitted from the optical semiconductor element 5 can be improved. Therefore, reduction in luminosity can be suppressed, and excellent viewing angle can be achieved. When an LD is used particularly as the optical semiconductor element 5, speckle noise of light irradiated from the optical semiconductor device 8 can be reduced. Productivity of the optical semiconductor device 8 is excellent, and therefore production costs can be reduced. Furthermore, the optical semiconductor device 8 has excellent heat resistance and heat-releasing characteristics.

Second Embodiment

An embodiment of the optical semiconductor device 8 in the second embodiment and production method thereof are described with reference to FIG. 3A to FIG. 3C. In the second embodiment, those members that are the same as the above-described first embodiment are given the same reference numerals, and descriptions thereof are omitted.

The method for producing the optical semiconductor device 8 in the second embodiment includes, for example, step of producing an encapsulation sheet (ref: FIG. 3A), step of disposing the encapsulation sheet (ref: FIG. 3B), and an encapsulating step (ref: FIG. 3C). The steps are described below.

In the step of producing an encapsulation sheet, as shown in FIG. 3A, an encapsulating layer 3 is laminated on the phosphor ceramic plate 1.

The encapsulating layer 3 is disposed on the entire upper face (one surface) of the phosphor ceramic plate 1, and is formed into a sheet shape from the above-described encapsulation resin composition.

For the method of laminating the encapsulating layer 3 on the upper face of the phosphor ceramic plate 1, for example, the following methods are used: a method in which the encapsulating layer 3 is directly formed on the phosphor ceramic plate 1, and a method in which the encapsulating layer 3 is formed on another release sheet, and then the encapsulating layer 3 is transferred from the release sheet to the phosphor ceramic plate 1 by, for example, a laminator, or thermocompression bonding.

When the encapsulation resin composition contains a thermosetting resin, the encapsulating layer 3 is heated to bring the encapsulating layer 3 composed of the encapsulation resin composition into a B-STAGE state (semi-cured state).

The heating conditions are as follows: the temperature is, for example, 50° C. or more, preferably 80° C. or more, and for example, 150° C. or less, preferably 140° C. or less. The heating time is, for example, 1 minute or more, preferably 5 minutes or more, and for example, for 100 minutes or less, preferably 15 minutes or less. The encapsulating layer 3 can be (or can be chosen not to) brought into the B-STAGE state depending on the types of the thermosetting resin.

The wavelength conversion encapsulation sheet 4 including the phosphor ceramic plate 1, and the encapsulating layer 3 laminated thereon is produced in this manner. The wavelength conversion encapsulation sheet 4 is composed of the phosphor ceramic plate 1 and the encapsulating layer 3, does not include the optical semiconductor element 5, and is an object of merchandise by itself as a component of the optical semiconductor device 8.

In the step of disposing the encapsulation sheet, as shown in FIG. 3B, the substrate 7 on which the optical semiconductor element 5 is mounted, and the wavelength conversion encapsulation sheet 4 are disposed to face each other. That is, the substrate 7 and the wavelength conversion encapsulation sheet 4 are disposed to face each other in spaced-apart relation so that the optical semiconductor element 5 and the encapsulating layer 3 face each other.

The optical semiconductor element 5 is connected to the electrode (not shown) of the substrate 7 by wire bonding. In wire bonding connection, the terminal (not shown) provided on the upper face of the optical semiconductor element 5 is electrically connected with electrodes (not shown) provided on the upper face of the substrate 7 through the wire 16 (ref: phantom line).

The optical semiconductor element 5 may be flip chip mounted to the substrate 7 (ref: solid line).

In the encapsulating step, as shown in FIG. 3C, the optical semiconductor element 5 is embedded with the encapsulating layer 3 of the wavelength conversion encapsulation sheet 4. When the optical semiconductor element 5 is connected with the substrate 7 by wire bonding, the optical semiconductor element 5 and the wire 16 are mounted.

To be specific, the encapsulating layer 3 is thermocompression bonded to the substrate 7. Preferably, the wavelength conversion encapsulation sheet 4 and the substrate 7 are pressed with flat plates.

The conditions for the thermocompression bonding are as follows: the temperature is, for example, 80 to 220° C., the pressure is, for example, 0.01 to 1 MPa, and the pressing time is, for example, 1 to for 10 minutes.

With the thermocompression bonding, the upper face and the side face of the optical semiconductor element 5 and the wire are covered with the encapsulating layer 3. That is, the optical semiconductor element 5 and the wire are embedded in the encapsulating layer 3.

The upper face of the substrate 7 exposed from the optical semiconductor element 5 is covered with the encapsulating layer 3, and the wavelength conversion encapsulation sheet 4 is bonded to the optical semiconductor element 5 and the substrate 7.

Then, with the thermocompression bonding, when the encapsulation resin composition contains a thermosetting resin, the encapsulating layer 3 is brought into a C stage state (completely cured state).

The optical semiconductor device 8 in which the optical semiconductor element 5 is encapsulated with the encapsulating layer 3 is produced in this manner.

That is, the optical semiconductor device 8 includes the substrate 7, the optical semiconductor element 5 mounted on the substrate 7, the encapsulating layer 3 formed on the substrate 7a and encapsulating the optical semiconductor element 5, and the phosphor ceramic plate 1 disposed on the encapsulating layer 3 to face the optical semiconductor element 5.

The optical semiconductor device 8 in the second embodiment can achieve the operations and effects of the first embodiment as well.

First Modified Example of Second Embodiment

Figure 4A:
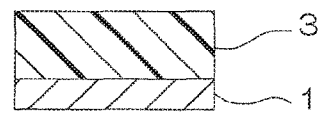
FIG. 4A to FIG. 4E are process diagrams illustrating steps of producing the optical semiconductor device of the present invention in a first modified example (embodiment in which encapsulated optical semiconductor element is produced) of the second embodiment using the phosphor ceramic of FIG. 1B, FIG. 4A illustrating a step of producing the encapsulation sheet, FIG. 4B illustrating a step of disposing the encapsulation sheet, FIG. 4C illustrating an encapsulating step, FIG. 4D illustrating a releasing step, and FIG. 4E illustrating a mounting step.
Figure 4B:
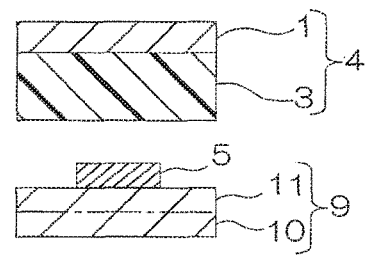
Figure 4C:
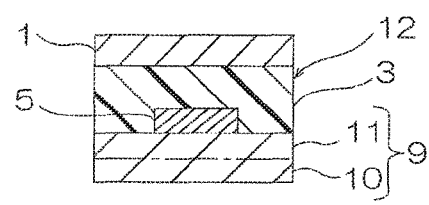

In the embodiment of the second embodiment of the above-described optical semiconductor device 8, as shown in FIG. 3C, the optical semiconductor device 8 is directly produced by encapsulating the optical semiconductor element 5 mounted on the substrate 7 with the wavelength conversion encapsulation sheet 4. But for example, as shown in FIG. 4C, the optical semiconductor device 8 can also be produced after producing an encapsulated optical semiconductor element 12 by encapsulating the optical semiconductor element 5 supported by a support sheet 9 without being mounted on the substrate 7.

Figure 4D:
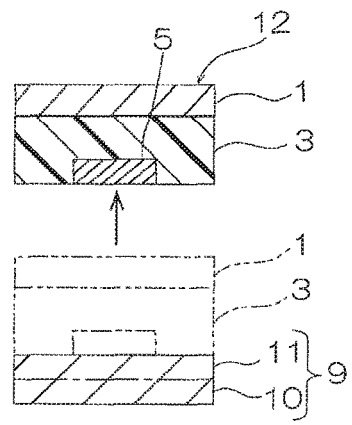
Figure 4E:
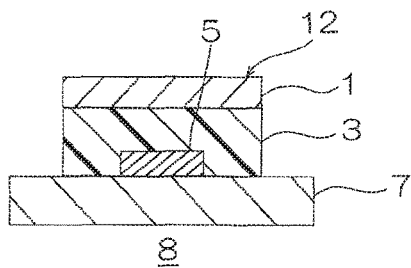

In the first modified example, the production method of the optical semiconductor device 8 includes, for example, a step of producing an encapsulation sheet (ref: FIG. 4A), a step of disposing the encapsulation sheet (ref: FIG. 4B), an encapsulating step (ref: FIG. 4C), a releasing step (ref: FIG. 4D), and a mounting step (ref: FIG. 4E). The steps are described below.

The step of producing an encapsulation sheet is, as shown in FIG. 4A, the same as the above-described step of producing an encapsulation sheet of FIG. 3A.

In the step of disposing the encapsulation sheet, as shown in FIG. 4B, the support sheet 9 and the optical semiconductor element 5 supported by the support sheet 9 are disposed to face the wavelength conversion encapsulation sheet 4. That is, the support sheet 9 and the wavelength conversion encapsulation sheet 4 are disposed to face each other in spaced-apart relation so that the optical semiconductor element 5 and the encapsulating layer 3 face each other.

The support sheet 9 includes a support plate 10, and a pressure-sensitive adhesive layer 11 laminated on the upper face of the support plate 10.

The support plate 10 has a plate shape extending in surface direction, provided at a lower portion of the support sheet 9, and is formed into a shape that is the same as that of the support sheet 9 when viewed from the top. The support plate 10 is composed of a hard material that is not expandable in the surface direction. To be specific, such examples include oxides such as silicon oxide (quartz, etc.), sapphire, and alumina, metals such as stainless steel, and silicon. The support plate 10 has a thickness of, for example, 0.1 to 2 mm.

The pressure-sensitive adhesive layer 11 is formed on the entire upper face of the support plate 10. The pressure sensitive materials that form the pressure-sensitive adhesive layer 11 include pressure-sensitive adhesives such as acrylic pressure-sensitive adhesive and silicone pressure-sensitive adhesive. The pressure-sensitive adhesive layer 11 can also be formed from, for example, an active energy ray irradiation release sheet (to be specific, active energy ray irradiation release sheet described in Japanese Unexamined Patent Publication No. 2005-286003) which decreases its pressure sensitive adhesion by irradiation of active energy ray. The pressure-sensitive adhesive layer 11 has a thickness of, for example, 0.1 to 1 mm.

To prepare the support sheet 9, for example, the support plate 10 and the pressure-sensitive adhesive layer 11 are bonded. The pressure-sensitive adhesive layer 11 can also be directly laminated on the support plate 10 by the following application method: first, the support plate 10 is prepared, and then a varnish prepared from the above-described pressure sensitive materials and a solvent blended as necessary is applied on the support plate 10, and thereafter, as necessary, the solvent is dried.

The support sheet 9 has a thickness of, for example, 0.2 to 6 mm.

Then, the optical semiconductor element 5 is laminated on the support sheet 9. To be specific, a lower face of the optical semiconductor element 5 is allowed to contact the upper face of the pressure-sensitive adhesive layer 11.

In this manner, the optical semiconductor element 5 is disposed (placed) on the support sheet 9. That is, support sheet 9 supports the optical semiconductor element 5.

The encapsulating step is the same step as in the above-described encapsulating step of FIG. 3C, as shown in FIG. 4C.

In the releasing step, as shown in the arrow of FIG. 4D, the encapsulated optical semiconductor element 12 is removed from the upper face of the pressure-sensitive adhesive layer 11. To be specific, when the pressure-sensitive adhesive layer 11 is an active energy ray irradiation release sheet, the active energy ray is applied to the pressure-sensitive adhesive layer 11.

The encapsulated optical semiconductor element 12 including the optical semiconductor element 5, the encapsulating layer 3 encapsulating the optical semiconductor element 5, and the phosphor ceramic plate 1 disposed on the encapsulating layer 3 to face the optical semiconductor element 5 is produced in this manner. The encapsulated optical semiconductor element 12 is composed of the optical semiconductor element 5, the encapsulating layer 3, and the phosphor ceramic plate 1, does not include the substrate 7, and can be an object of merchandise by itself as a component of the optical semiconductor device 8.

The encapsulated optical semiconductor element 12 includes the phosphor ceramic plate 1, and therefore transmittance and scattering properties of light emitted from the optical semiconductor element 5 can be improved. Therefore, reduction of luminosity can be suppressed, and excellent viewing angle can be achieved. When an LD is used particularly as the optical semiconductor element 5, speckle noise of light irradiated from the encapsulated optical semiconductor element 12 can be reduced. Productivity of the encapsulated optical semiconductor element 12 is excellent, and therefore production costs can be reduced. Furthermore, the encapsulated optical semiconductor element 12 has excellent heat resistance and heat-releasing characteristics.

In the mounting step, thereafter, as shown in FIG. 4E, the encapsulated optical semiconductor element 12 is mounted on the substrate 7. To be specific, the terminal (not shown) provided at the lower face of the optical semiconductor element 5 is connected with the electrode (not shown) of the substrate 7 to flip chip mount the encapsulated optical semiconductor element 12 on the substrate 7.

In this manner, the optical semiconductor device 8 including the substrate 7, the optical semiconductor element 5, the encapsulating layer 3, and the phosphor ceramic plate 1 is produced.

The optical semiconductor device 8 of the first modified example can also achieve the operations and effects as described above.

Second Modified Example of the Second Embodiment

In the above-described embodiment of the optical semiconductor device 8 in the second embodiment, as shown in FIG. 3C, the optical semiconductor device 8 does not include the housing disposed to surround the optical semiconductor element 5 on the substrate 7. However, for example, as shown in FIG. 5, the optical semiconductor device 8 can also include the housing 13.

Figure 5:
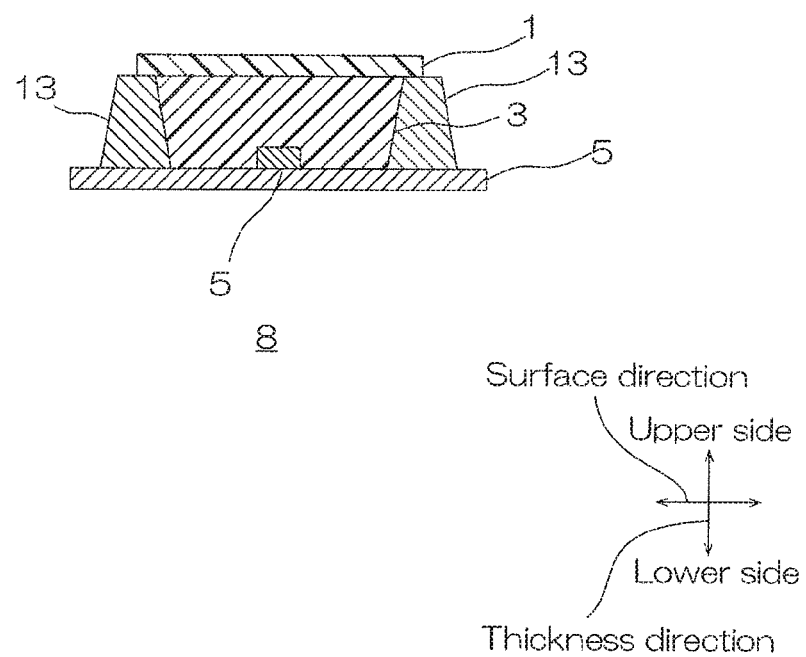
FIG. 5 shows a second modified example (embodiment in which the optical semiconductor device includes a housing) of the optical semiconductor device in the second embodiment.

The optical semiconductor device 8 of the second modified example of FIG. 5 includes a substrate 7, an optical semiconductor element 5 mounted on the substrate 7, a housing 13 formed on the substrate 7, an encapsulating layer 3 encapsulating the optical semiconductor element 5, and a phosphor ceramic plate 1 formed on the encapsulating layer 3.

The housing 13 is formed generally into a frame when viewed from the top, and generally formed into a trapezoidal cylindrical shape with its width decreasing toward above. The housing 13 is disposed in spaced-apart relation with the optical semiconductor element 5 so as to surround the optical semiconductor element 5.

The encapsulating layer 3 fills the housing 13.

The phosphor ceramic plate 1 is disposed on the entire upper face of the encapsulating layer 3, and on the inner end portion of the upper face of the housing 13.

The optical semiconductor device 8 of the second modified example can also achieve the operations and effects as described above.

Third Embodiment

The optical semiconductor device 8 in the third embodiment and the production method thereof are described with reference to FIG. 6A to FIG. 6C. In the third embodiment, the same reference numerals are given to those members that are the same as the above-described first embodiment, and their descriptions are omitted.

The production method of the optical semiconductor device 8 in the third embodiment includes, for example, a step of producing a circuit board (ref: FIG. 6A), a step of disposing the circuit board (ref: FIG. 6B), and a mounting step (ref: FIG. 6C). The steps are described below.

In the step of producing a circuit board, as shown in FIG. 6A, an electrode wiring 41 is laminated on the phosphor ceramic plate 1.

The electrode wiring 41 is formed as a conductive pattern integrally including an electrode 42 for electrically connecting with the terminal 44 of the optical semiconductor element 5, and a wiring 43 continued therefrom. The electrode wiring 41 is formed from, for example, conductor such as gold, copper, silver, and nickel.

Two (a pair of) electrodes 42 are provided for one optical semiconductor element 5 (ref: FIG. 6B). To be specific, the electrodes 42 are provided to correspond to the two terminals 44 formed on one optical semiconductor element 5.

A protection film (not shown) can also be formed on the surface (upper face and side face) of the electrode wiring 41. In view of oxidization prevention and connectivity, the protection film is formed as, for example, a plated layer composed of Ni and/or Au.

The size of the electrode wiring 41 is suitably set. To be specific, the electrode 42 has a maximum length of, for example, 0.03 mm or more, preferably 0.05 mm or more, and for example, 50 mm or less, preferably 5 mm or less. The interval between the adjacent electrodes 42 is, for example, 0.05 mm or more, preferably 0.1 mm or more, and for example, 3 mm or less, preferably 1 mm or less. The wiring 43 has a width of, for example, 20 μm or more, preferably 30 μm or more, and for example, 400 μm or less, preferably 200 μm or less.

The electrode wiring 41 has a thickness of, for example, 10 μm or more, preferably 25 μm or more, and for example, 200 μm or less, preferably 100 μm or less. The protection film (not shown) has a thickness of, for example, 100 nm or more, preferably 300 nm or more, and for example, 5 μm or less, preferably 1 μm or less.

In this method, as shown in FIG. 6A, the electrode wiring 41 is laminated on the upper face (one surface) of the phosphor ceramic plate 1.

The electrode wiring 41 is laminated on the upper face of the phosphor ceramic plate 1 by, for example, heat bonding method, print-heat bonding method, Mo—Mn method, copper sulfide method, copper metallization method, printing method, and transfer method. Preferably, heat bonding method and print-heat method are used.

In heat bonding method, for example, a conductor sheet for forming the electrode wiring 41 is allowed to contact the entire upper face of the phosphor ceramic plate 1, and then, heating is conducted in an inactive atmosphere such as Ar or $N_2$, at a temperature of 800 to 1200° C. to form a bonded substrate composed of the phosphor ceramic plate 1 and the conductor sheet. Thereafter, the conductor sheet is subjected to, for example, etching to form the electrode wiring 41.

In the print-heat bonding method, for example, the following is performed: a paste is prepared by blending conductor powder with a binder and a solvent of, for example, organic compounds, a print pattern of the above-described pattern is formed on the upper face of the phosphor ceramic plate 1 by printing with the paste, a conductor sheet is disposed with a dispenser along with the print pattern, and heating is conducted in an inactive atmosphere or vacuum at the above-described temperature. Thereafter, the conductor sheet is subjected to etching to form the conductive pattern.

The circuit board 40 including a phosphor ceramic plate 1 for mounting the optical semiconductor element 5 thereon, and an electrode wiring 41 laminated thereon for electrically connecting with the optical semiconductor element 5 is produced in this manner. The circuit board 40 is composed of the phosphor ceramic plate 1 and the electrode wiring 41, does not include the optical semiconductor element 5, and can be an object of merchandise by itself as a component of the optical semiconductor device 8.

The circuit board 40 includes the phosphor ceramic plate 1, and therefore transmittance and scattering properties of light emitted from the optical semiconductor element 5 can be improved. Therefore, reduction in luminosity can be suppressed, and excellent viewing angle can be achieved. When an LD is used particularly as the optical semiconductor element 5 to produce the optical semiconductor device 8, speckle noise of light irradiated from the optical semiconductor device 8 can be reduced. Productivity of the circuit board 40 is excellent, and therefore production costs can be reduced. Furthermore, the circuit board 40 has excellent heat resistance and heat-releasing characteristics.

The circuit board 40 includes the phosphor ceramic plate 1, and therefore a phosphor layer does not have to be provided at the lower face of the substrate, and the wavelength of the light emitted towards a lower side can be converted by the phosphor ceramic plate 1. Therefore, luminous flux at a lower side of the optical semiconductor device 8 can be improved, and the number of components in the optical semiconductor device 8 can be reduced, thereby achieving a simple structure of the optical semiconductor device 8. As a result, production steps of the optical semiconductor device 8 can be reduced, production method can be simplified, productivity of the optical semiconductor device 8 can be improved, and production costs can be reduced.

In the step of disposing the circuit board, as shown in FIG. 6B, the optical semiconductor element 5 and the circuit board 40 are disposed to face each other. That is, the optical semiconductor element 5 and the circuit board 40 are disposed to face each other in spaced-apart relation so that the terminal 44 provided at the lower face of the optical semiconductor element 5 faces the electrode wiring 41 provided at the upper face of the circuit board 40.

In the mounting step, thereafter, as shown in FIG. 6C, the optical semiconductor element 5 is mounted on the circuit board 40. To be specific, the terminal 44 of the optical semiconductor element 5 is connected with the electrode 42 of the circuit board 40 to flip chip mount the optical semiconductor element 5 to the circuit board 40.

The optical semiconductor device 8 in which the terminal 44 is electrically connected with the electrode 42 is produced in this manner.

That is, the optical semiconductor device 8 includes the circuit board 40, and the optical semiconductor element 5 mounted on the circuit board 40 so as to be electrically connected with the electrode wiring 41.

Thereafter, as necessary, as shown by the phantom line in FIG. 6C, the encapsulating layer 3 can also be provided on the optical semiconductor device 8. The encapsulating layer 3 is disposed on the circuit board 40 so as to cover the optical semiconductor element 5. The encapsulating layer 3 can be a phosphor encapsulating layer formed from an encapsulation resin composition containing the above-described phosphor and the above-described transparent resin.

The optical semiconductor device 8 of the third embodiment can achieve the operations and effects of the first embodiment as well.

In addition, in the optical semiconductor device 8 of the third embodiment, the circuit board 40 includes the phosphor ceramic plate 1, and therefore a phosphor layer does not have to be provided at the lower side of the phosphor ceramic plate 1, and the wavelength of the light emitted from the optical semiconductor element 5 toward a lower side can be converted by the phosphor ceramic plate 1. Therefore, luminous flux at a lower side can be excellent, the number of components can be decreased, and the structure of the optical semiconductor device 8 can be made simple. As a result, productivity of the optical semiconductor device 8 can be improved.

Furthermore, in the optical semiconductor device 8, when the encapsulating layer 3 is a phosphor encapsulating layer, the optical semiconductor element 5 can be encapsulated, reliability is improved, and phosphor encapsulating layer allows the wavelength of the light emitted from the optical semiconductor element 5 toward the upper side and lateral side to be converted, improving the luminous flux of the light. Therefore, the optical semiconductor device 8 can be made as a both-side emitting type, with which light can be emitted both from upper face and lower face.

3. Light-Emitting Device

Next, description is given below of a lighting device 20 as an example of the light-emitting device including a phosphor ceramic plate 1 with reference to FIG. 7 to FIG. 8.

As shown in FIG. 7, a lighting device 20 includes a lighting housing 22, a transparent member 23, a light source 24, a reflection mirror 25, and a wavelength conversion heat dissipation member 26.

The lighting housing 22 is formed generally into a cylindrical shape which extends in front-back direction, is closed at the back side, and is open at the front side. The lighting housing 22 accommodates therein a transparent member 23, a light source 24, a reflection mirror 25, and a wavelength conversion heat dissipation member 26 to be described later.

The transparent member 23 has a generally circular shape when viewed from the rear, and is formed into a plate shape having a thin thickness in front-back direction. The outline shape of the transparent member 23 is formed so as to coincide with the inner circumferential edge at the front edge of the lighting housing 22 when projected in front-back direction.

The transparent member 23 is provided at the front edge of the lighting housing 22. To be specific, the transparent member 23 is accommodated in the lighting housing 22 so that the front end edge of the lighting housing 22 is flush with the front face (front side surface) of the transparent member 23 in up-down direction.

Examples of the light source 24 include a semiconductor light sources such as a light-emitting diode (LED) and a laser diode (LD). The light source 24 is provided at the back side of the transparent member 23 in spaced-apart relation, at a generally center portion of inside the lighting housing 22 in up-down direction and width direction (left-right directions). The light source 24 is connected to an external wiring 28 introduced from outside the lighting housing 22. The light source 24 emits light such as monochromatic light to the front side based on electricity supplied from the external wiring 28.

The reflection mirror 25 is formed into a generally circular shape when viewed from the rear, and is generally a semiarc dome shape when viewed in lateral cross section. The outline shape of the reflection mirror 25 is formed so as to coincide with the outer end edge of the transparent member 23 when projected in front-back direction. The reflection mirror 25 is disposed in spaced-apart relation with the light source 24 at the other side (back side) of the transparent member 23, and one side (front side) of the light source 24. The reflection mirror 25 is accommodated in the lighting housing 22 so that its front end edge is in contact with the back face of the transparent member 23.

At the center (center in up-down direction and width direction) of the reflection mirror 25, a through hole 27 is formed for light from the light source 24 to pass through. The reflection mirror 25 reflects the diffused light toward the front side: the light passes through the through hole 27 toward the front side and diffuses toward the back side at the wavelength conversion heat dissipation member 26 (described later).

The wavelength conversion heat dissipation member 26 is provided at a front side in the lighting housing 22. To be specific, the wavelength conversion heat dissipation member 26 is provided so as to face the reflection mirror 25 in spaced-apart relation at a front side, and is disposed adjacent to the back face (back side surface) of the transparent member 23. The wavelength conversion heat dissipation member 26 includes a heat diffusion retention member 29 and a wavelength conversion bonding member 30, as shown in FIG. 8A and FIG. 8B.

The heat diffusion retention member 29 is formed into a generally rectangular shape extending in up-down direction when viewed from the rear, and is disposed adjacent to the transparent member 23. To be specific, the heat diffusion retention member 29 is disposed so that the front face of the heat diffusion retention member 29 is in contact with the back face of the transparent member 23.

The heat diffusion retention member 29 includes a placement portion 31 and a fixing portion 32.

The placement portion 31 is formed into a generally rectangular shape when viewed from the rear and is formed to have a thickness in front-back direction. The placement portion 31 is disposed so that the front face of the placement portion 31 is in contact with a generally center portion of the back face of the transparent member 23 when viewed from the rear.

The fixing portion 32 is formed integrally with the placement portion 31 so as to extend from the front side lower end of the placement portion 31 to the lower side. The fixing portion 32 is formed into a generally rectangular shape extending in up-down direction when viewed from the rear, and is formed into a flat plate shape having a thickness smaller than the thickness of the front-back direction of the placement portion 31. The upper side front face of the fixing portion 32 is in contact with the back face of the transparent member 23, and the fixing portion 32 is bent back side at a point in up-down direction so as to be spaced apart from the transparent member 23. One end (lower end) of the fixing portion 32 is fixed at the circumferential surface (inner end edge) of the lighting housing 22, passing through the reflection mirror 25.

The heat diffusion retention member 29 is formed from a material having excellent thermal conductivity, for example, from thermal conductive metal such as aluminum and copper, and ceramic materials such as AlN.

The wavelength conversion bonding member 30 is provided at a back face of the placement portion 31.

The wavelength conversion bonding member 30 includes a bonding layer 34 and the phosphor ceramic plate 1.

The bonding layer 34 has a generally rectangular shape when viewed from the rear, and is formed into a flat plate shape. The bonding layer 34 is provided at the back face of a placement portion 31 and the front face (one surface) of the phosphor ceramic plate 1. That is, the bonding layer 34 is disposed between the placement portion 31 and the phosphor ceramic plate 1. The bonding layer 34 is overlapped with the placement portion 31 when projected in front-back direction. The bonding layer 34 is, to be specific, formed to have the same shape with the placement portion 31 when viewed from the rear.

The bonding layer 34 preferably has light reflectivity and heat-releasing characteristics, and, for example, is formed by curing a light reflective heat-releasing curing composition.

Examples of the light reflective heat-releasing curing composition include a ceramic ink; a curable resin composition containing a curable resin and inorganic particles; and an aqueous silicate solution containing alkali metal silicate and inorganic particles.

For the ceramic ink, a commercially available product can be used, and to be specific, examples thereof include ceramic inks manufactured by AIN Co., Ltd. (TYPE RG, TYPE AN, TYPE UV, and TYPE SD).

Examples of the curable resin contained in the curable resin composition include a curable silicone resin, an epoxy resin, and an acrylic resin. For the curable silicone resin, a commercially available product (trade name: KER-2500, manufactured by Shin-Etsu Chemical Co., Ltd., trade name: LR-7665, manufactured by Wacker asahi kasei silicone co., ltd., etc.) may be used.

Examples of the inorganic substance composing the inorganic particles include inorganic oxides such as silicon dioxide, titanium dioxide, and metals such as silver and aluminum, and composite oxides such as titanium acid composite oxide (e.g., barium titanate, potassium titanate).

The inorganic particles have an average particle size (average maximum length) of, for example, 0.1 to 50 μm.

The phosphor ceramic plate 1 has a generally rectangular shape when viewed from the rear, and is formed into a plate shape. The phosphor ceramic plate 1 is provided at the back face of the bonding layer 34. The phosphor ceramic plate 1 is overlapped with the bonding layer 34 and the placement portion 31 when projected in front-back direction, to be specific, the phosphor ceramic plate 1 is formed so as to have the same shape as those of the bonding layer 34 and the placement portion 31 when viewed from the rear.

The phosphor ceramic plate 1 is disposed so that it is on the same line with the light source 24 and the through hole 27. To be specific, the light source 24, through hole 27, and phosphor ceramic plate 1 are accommodated in the lighting housing 22 so as to coincide with the axis line of the lighting housing 22.

Then, in the lighting device 20 including the phosphor ceramic plate 1, the light $h_0$ emitted from the light source 24 passes through the through hole 27, and at the same time with the wavelength of the light is converted to that of white light at the phosphor ceramic plate 1, the light is diffused in omnidirection. At that time, phosphor ceramic plate 1 has excellent transmittance and scattering properties, and therefore the white light can be efficiently and widely reflected to the reflection mirror 25 side (back side) (ref: $h_1$ to $h_4$ in FIG. 7). That is, while reducing loss of light amount at the wavelength conversion heat dissipation member 26, reflection to the reflection mirror 25 side can be achieved at high efficiency for a wider area. Therefore, excellent luminosity released to the front side (and to the outside), and excellent viewing angle can be achieved at the reflection mirror 25. Speckle noise of light irradiated from the lighting device 20 can be reduced as well.

Productivity of the lighting device 20 is excellent, and therefore production costs can be reduced. Furthermore, the lighting device 20 has excellent heat resistance and heat-releasing characteristics.

The lighting device 20 can be suitably used for, for example, far-reaching use such as lighting for vehicles, pendant lights, road lights, and stage lighting products.

EXAMPLES

In the following, the present invention is described in further detail with reference to Examples and Comparative Examples. However, the present invention is not limited to these. The specific numeral values such as mixing ratio (content), physical property values, and parameters used in the description below can be replaced with the upper limit value (numeral values defined with "or less". "less than") or the lower limit value (numeral values defined with "or more", "more than") of the corresponding mixing ratio (content), physical property values, parameters in the above-described "DESCRIPTION OF EMBODIMENTS".

Example 1

A phosphor material powder composed of 11.34 g of yttrium oxide particles (purity 99.99%, lot: N-YT 4CP manufactured by Nippon yttrium co., ltd.), 8.577 g of aluminum oxide particles (purity 99.99%, product number "AKP-30" manufactured by Sumitomo Chemical Co., Ltd.), and 0.087 g of cerium oxide particles (purity 99.99%) was prepared.

20 g of the phosphor material powder prepared was mixed with water soluble binder resin ("WB 4101", manufactured by Polymer Innovations, Inc.) so that the solid content volume ratio was 60:40, and furthermore, distilled water was added. The mixture was put into an alumina-made vessel, zirconia balls having a diameter of 3 mm were added, and the mixture was subjected to wet blending with a ball mill for 24 hours, thereby preparing a slurry of phosphor material particles.

Then, to the prepared slurry, organic particles (polymethyl methacrylate, average particle size 3.5 μm) were added so as to be 3.0% by volume relative to a total content of the phosphor material powder and the organic particles, and the mixture was further subjected to wet blending, thereby producing a phosphor composition slurry.

Then, the obtained phosphor composition slurry was tape-casted on a PET film by doctor blade method, and dried at 70° C. for 5 minutes, thereby producing a green sheet having a thickness of 90 μm. Thereafter, the green sheet was released from the PET film.

Then, the green sheet was cut into a size of 20 mm×20 mm. Two sheets of the green sheet that was cut were prepared, and the two green sheets were heat laminated using a 2-axis hot press, thereby preparing the green sheet laminate.

Then, the prepared green sheet laminate was heated in an electric muffle furnace in air at a temperature increase speed of 1° C./min to 1200° C. to perform de-binder processing, in which an organic component such as binder resin is decomposed and removed. Thereafter, the green sheet laminate was transferred to a high temperature furnace, and heated under reduction atmosphere at a temperature increase speed of 5° C./min to 1750° C. The baking was performed at that temperature for 5 hours, thereby producing a phosphor ceramic plate having a thickness (T) of 120 µm and composed of $Y_3Al_5O_{12}$: Ce.

Example 2

A phosphor ceramic plate was produced in the same manner as in Example 1, except that 3.0% by volume of organic particles (polymethyl methacrylate, average particle size 4.0 µm) were added instead of adding 3.0% by volume of organic particles (polymethyl methacrylate, average particle size 3.5 µm).

Example 3

A phosphor ceramic plate was produced in the same manner as in Example 1, except that 3.0% by volume of organic particles (polymethyl methacrylate, average particle size 5.0 µm) were added instead of adding 3.0% by volume of organic particles (polymethyl methacrylate, average particle size 3.5 µm).

Example 4

A phosphor ceramic plate was produced in the same manner as in Example 1, except that 6.5% by volume of organic particles (polymethyl methacrylate, average particle size 6.5 µm) were added instead of adding 3.0% by volume of organic particles (polymethyl methacrylate, average particle size 3.5 µm).

Example 5

A phosphor ceramic plate was produced in the same manner as in Example 1, except that 12.0% by volume of organic particles (polymethyl methacrylate, average particle size 12.5 µm) were added instead of adding 3.0% by volume of organic particles (polymethyl methacrylate, average particle size 3.5 µm).

Example 6

A phosphor ceramic plate was produced in the same manner as in Example 1, except that 9.0% by volume of organic particles (polymethyl methacrylate, average particle size 18.0 µm) were added instead of adding 3.0% by volume of organic particles (polymethyl methacrylate, average particle size 3.5 µm).

Example 7

A phosphor ceramic plate having a thickness (T) of 150 min was produced in the same manner as in Example 1, except that an amount of the phosphor composition slurry to be applied was adjusted, and the thickness of the green sheet was adjusted to be thick.

Example 8

A phosphor ceramic plate was produced in the same manner as in Example 2, except that yttrium oxide particles (purity 99.99 mass %, lot: N-YT 4CP, manufactured by Nippon yttrium co., ltd.) was changed to yttrium oxide particles (purity 99.8 mass %, Manufactured by Nanostructured & Amorphous Materials, Inc.).

Comparative Example 1

A phosphor ceramic plate was produced in the same manner as in Example 1, except that instead of adding 3.0% by volume of organic particles (polymethyl methacrylate, average particle size 3.5 µm), 4.0% by volume of organic particles (polymethyl methacrylate, average particle size 2.5 µm) was added.

Comparative Example 2

A phosphor ceramic plate was produced in the same manner as in Example 1, except that instead of adding 3.0% by volume of organic particles (polymethyl methacrylate, average particle size 3.5 µm), 1.5% by volume of organic particles (polymethyl methacrylate, average particle size 4.0 µm) was added.

Comparative Example 3

A phosphor ceramic plate was produced in the same manner as in Example 1, except that instead of adding 3.0% by volume of organic particles (polymethyl methacrylate, average particle size 3.5 µm), 15.0% by volume of organic particles (polymethyl methacrylate, average particle size 4.0 µm) was added.

Comparative Example 4

A phosphor ceramic plate was produced in the same manner as in Example 1, except that instead of adding 3.0% by volume of organic particles (polymethyl methacrylate, average particle size 3.5 µm), 10.0% by volume of organic particles (polymethyl methacrylate, average particle size 25.0 µm) was added.

(Calculation of Pore Volume)

Figure 9:
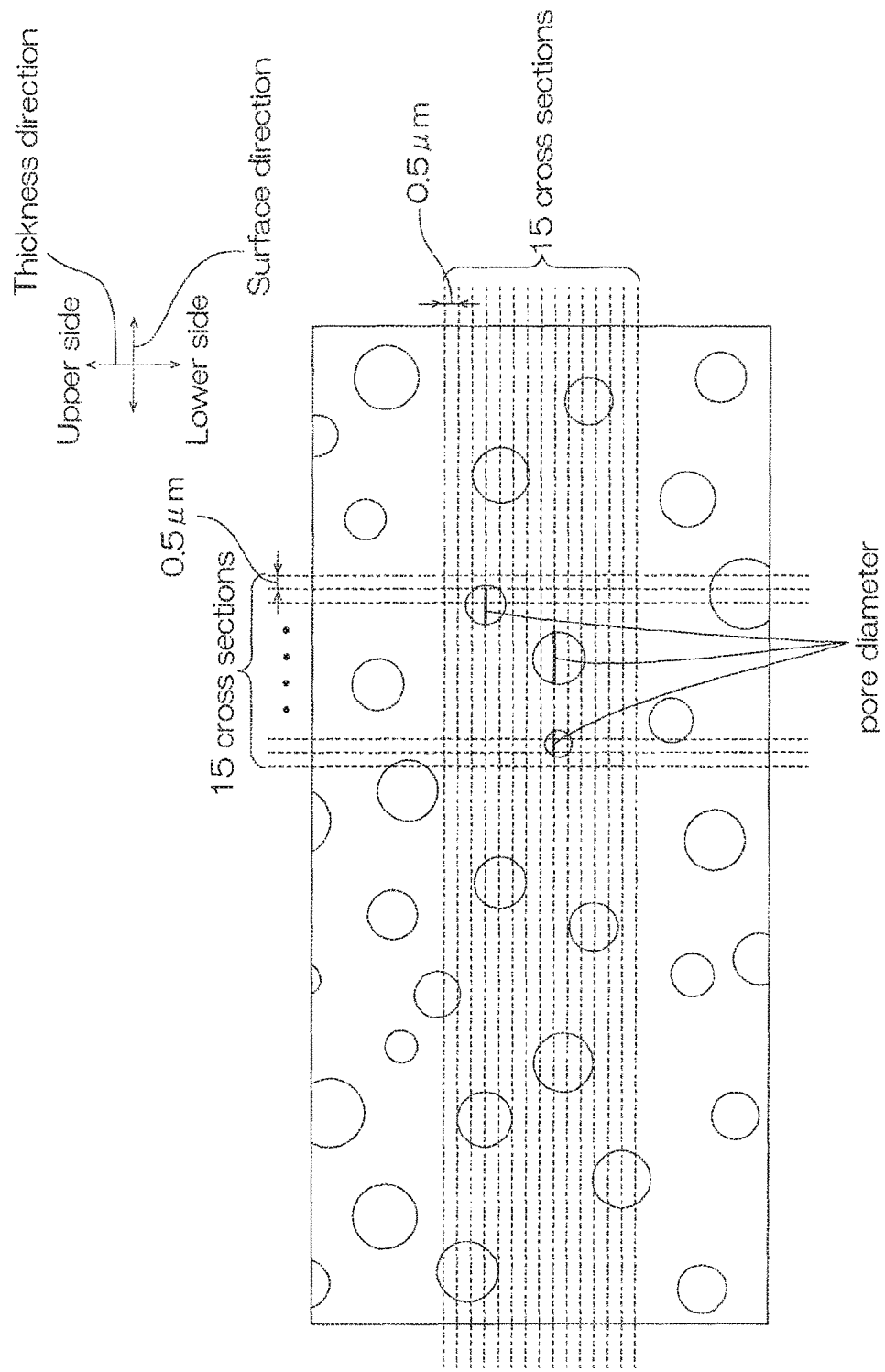
FIG. 9 shows a schematic view of a method for measuring pores of the phosphor ceramic plate in Examples.

The phosphor ceramic plate of Examples and Comparative Examples was cut in the surface direction (direction perpendicular to thickness direction, horizontal direction), and its cross sectional surface (surface direction) was observed with a laser microscope (device name: laser tech, VL 2000D, object lens 20×, magnification 1800) for pore diameter. Thereafter, cutting was further performed at an interval of 0.5 µm in the surface direction, and a total of 15 cross sectional surfaces (thickness direction 7.5 µm) were observed. At this time, of the pores observed at the cross sectional surface, for the same pore, the maximum length out of the 15 cross sectional surfaces was used as the pore diameter (surface direction) of the pore (ref: FIG. 9).

The pores were sorted out into pores with a pore diameter of less than 3.0 µm (small pore), pores with a pore diameter of 3.0 µm or more and 12.0 µm or less (middle pore), and a pore diameter of more than 12.0 µm (large pore), and the pore volume was calculated based on sphericity, and a total volume of the sorted pores was calculated. The calculated total volume was divided by the volume of the phosphor ceramic plate (the portion measured for the pore, including the pores) to obtain the pore volume percentage (surface direction).

The phosphor ceramic plate was cut in the thickness direction, and the cross sectional surfaces (thickness direction) were observed for 15 surfaces in the same manner as described above, and the pore volume percentage (thickness direction) was determined in the above-described method.

The pore volume percentage (surface direction) and the pore volume percentage (thickness direction) were averaged to obtain the pore volume percentage of the phosphor ceramic plate of the present invention. The results are shown in Table 1.

(Calculation of Average Pore Diameter)

The average of the pore diameter of the pores (total pore diameter of the pores/the number of pores) was obtained from the pore diameter of the pores calculated as described above. The average of the pore diameter (surface direction) and the average of the pore diameter (thickness direction) were averaged to obtain the average pore diameter. The results are shown in Table 1.

(Transmittance)

The phosphor ceramic plate of Examples and Comparative Examples was measured using a spectrophotometer (ultraviolet and visible infrared spectrophotometer V-670, manufactured by JASCO Corporation) at an arbitrary three points to measure a total luminous transmittance (wavelength 800 nm), and the average of the three points were used as the transmittance. The results are shown in Table 1.

(Scattering Properties)

The scattering properties of the phosphor ceramic plate of Examples and Comparative Examples were evaluated based on the luminous intensity distribution of the optical semiconductor device.

An optical semiconductor device was made as follows: a blue light-emitting diode chip (manufactured by Cree, Inc., product number "C 450EZ 1000-0123") was die attached with Au—Sn solder in a cavity of a cavity-attached multilayer ceramic substrate (manufactured by Sumitomo Metal Electronics Devices Inc., product number "207806", housing height 0.6 mmt, housing material alumina reflectivity 75%), and wire bonded with Au wire.

The phosphor ceramic plate was disposed on the housing of the optical semiconductor device, and the angle dependence of the package at vertical direction and an angle of 45 degrees was evaluated. Based on the vertical direction, it was evaluated as excellent when the difference of CIE chroma x was within ±0.02, it was evaluated as good when the difference of CIE chroma x was within ±0.04, and others were evaluated as bad. The results are shown in Table 1.

(Measurement of Impurity)

Impurities of Na element, Mg element, and Fe element in the phosphor ceramic plate of Examples and Comparative Examples were measured by ICP-MS analysis. The results are shown in Table 1.

(Measurement of Quantum Efficiency)

The quantum efficiency of the phosphor ceramic plate of Examples and Comparative Examples were measured with a quantum efficiency measurement system (manufactured by Otsuka Electronics Co. Ltd., "QE 2100"). The results are shown in Table 1.

(Measurement of Speckle Contrast Ratio)

A LD excited lighting device shown in FIG. 7 was made using a blue LD light source (manufactured by NEOARK Corporation, "TCSQ 0445-1600") as a light source 24 and the phosphor ceramic plate of Examples and Comparative Examples as a phosphor ceramic plate 1.

The speckle contrast ratio of the light emitted from the lighting device (average value of light at h1 to h4) was measured using a speckle contrast measurement device (manufactured by Oxide Corporation., "Dr.SPECKLE"). The results are shown in Table 1. The speckle contrast ratio of the light emitted without using the phosphor ceramic plate was (only LD light) was 0.45.

TABLE 1

| | | Example 1 | Example 2 | Example 3 | Example 4 | Example 5 | Example 6 |
|---|---|---|---|---|---|---|---|
| Calculated volume of pore (vol %) | Below 3.0 µm | 0.8 | 1.0 | 0.4 | 0.3 | 0.1 | 0.2 |
| | 3.0~12.0 µm | 2.2 | 2.0 | 2.5 | 6.2 | 7.8 | 3.2 |
| | More than 12.0 µm | 0.1 | 0.1 | 0.8 | 1.2 | 3.0 | 5.2 |
| Average pore diameter (µm) | | 2.6 | 3.3 | 4.0 | 6.1 | 12.3 | 15.1 |
| Thickness (µm) | | 120 | 120 | 120 | 120 | 120 | 120 |
| 1.30 × (−log T) | | 1.2 | 1.2 | 1.2 | 1.2 | 1.2 | 1.2 |
| Transmittance (%) | | 73.7 | 70.8 | 72.5 | 71.0 | 61.5 | 72.0 |
| Scattering properties | | Good | Excellent | Excellent | Excellent | Excellent | Good |
| Quantum efficiency | | More than 95 | More than 95 | More than 95 | More than 95 | More than 95 | More than 95 |
| Impurities amount | Na (ppm) | Below 50 | Below 50 | Below 50 | Below 50 | Below 50 | 52 |
| | Mg (ppm) | Below 20 | Below 20 | Below 20 | Below 20 | 21 | 23 |
| | Fe (ppm) | Below 10 | Below 10 | Below 10 | Below 10 | 12 | 11 |
| Speckle ratio contrast | | 0.06 | 0.08 | 0.09 | 0.10 | 0.12 | 0.12 |

| | | Example 7 | Example 8 | Comparative example 1 | Comparative example 2 | Comparative example 3 | Comparative example 4 |
|---|---|---|---|---|---|---|---|
| Calculated volume of pore (vol %) | Below 3.0 µm | 0.6 | 1.0 | 2.0 | 0.1 | 2.1 | 0 |
| | 3.0-12.0 µm | 2.1 | 2.0 | 1.2 | 0.6 | 13.6 | 1.2 |
| | More than 12.0 µm | 0.1 | 0.1 | 0.1 | 0.1 | 0.0 | 5.5 |
| Average pore diameter (µm) | | 2.6 | 3.3 | 2.0 | 3.5 | 3.5 | 15.5 |
| Thickness (µm) | | 150 | 120 | 120 | 120 | 120 | 120 |
| 1.30 × (−log T) | | 1.1 | 1.2 | 1.2 | 1.2 | 1.2 | 1.2 |

TABLE 1-continued

| | | | | | | |
|---|---|---|---|---|---|---|
| Transmittance (%) | 69.5 | 70.8 | 65.4 | 80.5 | 42.1 | 81.3 |
| Scattering properties | Excellent | Excellent | Bad | Bad | Bad | Bad |
| Quantum efficiency | More than 95 | 93 | More than 95 | More than 95 | More than 95 | More than 95 |
| Impurities amount  Na (ppm) | Below 50 | 69 | Below 50 | Below 50 | Below 50 | Below 50 |
| Mg (ppm) | Below 20 | 28 | Below 20 | Below 20 | Below 20 | Below 20 |
| Fe (ppm) | Below 10 | 18 | Below 10 | Below 10 | Below 10 | 11 |
| Speckle ratio contrast | 0.10 | 0.11 | 0.10 | 0.18 | 0.09 | 0.19 |

INDUSTRIAL APPLICABILITY

The phosphor ceramic of the present invention can be applied to various industrial products, for example, for optical use in optical semiconductor devices.

DESCRIPTION OF REFERENCE NUMERAL

1 phosphor ceramic plate
2 adhesive layer
3 encapsulating layer
5 semiconductor element
7 substrate
20 lighting device
24 light source
25 reflection mirror
27 through hole
40 circuit board
41 electrode wiring

The invention claimed is:

1. A phosphor ceramic having pores with a pore diameter of 3.0 μm or more and 12.0 μm or less,
wherein in the phosphor ceramic, a volume percentage of pores with a pore diameter of 3.0 μm or more and 12.0 μm or less is 1.5% by volume or more and 9.5% by volume or less.

2. The phosphor ceramic according to claim 1,
wherein the phosphor ceramic is platy, and satisfies the formula below:

$$V \leq 1.30 \times (-\log T)$$

(where V represents a volume percentage (%) of pores with a pore diameter of less than 3.0 μm, and T represents the thickness (mm) of the phosphor ceramic).

3. The phosphor ceramic according to claim 1, wherein at least one of (1) to (3) below is satisfied:
(1) 67 ppm or less of Na is contained,
(2) 23 ppm or less of Mg is contained, and
(3) 21 ppm or less of Fe is contained.

4. The phosphor ceramic according to claim 1, wherein the phosphor ceramic has an average pore diameter of 3.0 μm or more and 10.0 μm or less.

5. An optical semiconductor device comprising, in order:
a substrate,
an optical semiconductor element mounted on the substrate,
an adhesive layer, and
the phosphor ceramic according to claim 1 disposed on the adhesive layer.

6. An optical semiconductor device comprising, in order:
a substrate,
an optical semiconductor element mounted on the substrate,
an encapsulating layer encapsulating the optical semiconductor element, and
the phosphor ceramic according to claim 1 disposed on the encapsulating layer.

7. An encapsulated optical semiconductor element comprising, in order:
an optical semiconductor element,
an encapsulating layer encapsulating the optical semiconductor element, and
the phosphor ceramic according to claim 1 disposed on the encapsulating layer.

8. A circuit board comprising:
the phosphor ceramic according to claim 1 for mounting an optical semiconductor element, and
an electrode wiring for electrically connecting with the optical semiconductor element laminated on one surface of the phosphor ceramic.

9. A light-emitting device comprising:
a light source that emits light to one side,
a reflection mirror disposed on one side in spaced-apart relation from the light source, and in which a through hole for the light to pass through is formed, and
the phosphor ceramic according to claim 1 disposed on one side in spaced-apart relation from the reflection mirror for the light to be emitted.

* * * * *